United States Patent [19]

Sato et al.

[11] Patent Number: 4,510,458

[45] Date of Patent: Apr. 9, 1985

[54] AMPLIFIER CIRCUIT

[75] Inventors: Tetsuo Sato; Yasuo Kominami, both of Takasaki; Yoshiyuki Takizawa, Tokorozawa; Akira Haeno, Iruma, all of Japan

[73] Assignees: Hitachi, Ltd.; Pioneer Electronic Corp., both of Tokyo, Japan

[21] Appl. No.: 409,051

[22] Filed: Aug. 18, 1982

[30] Foreign Application Priority Data

Aug. 28, 1981 [JP] Japan .............................. 56-134000

[51] Int. Cl.³ .............................................. H03F 3/45
[52] U.S. Cl. ....................................... 330/260; 330/85
[58] Field of Search ................. 330/260, 255, 85, 293; 307/359

[56] References Cited

U.S. PATENT DOCUMENTS 4,290,024 9/1981 Yokoyama ........................... 330/85

Primary Examiner—James B. Mullins
Assistant Examiner—G. Wan
Attorney, Agent, or Firm—Antonelli, Terry & Wands

[57] ABSTRACT

An amplifier circuit has an operational amplifier and a negative feedback circuit. An input signal is applied to the non-inverting input terminal of the operational amplifier, whereby a first output signal is provided from the output terminal of the operational amplifier. The first output signal is fed back to the inverting input terminal of the operational amplifier through the negative feedback circuit. The negative feedback signal of the negative feedback circuit is fed back to the inverting input terminal through an impedance converter. Thus, a second output signal of low distortion factor is derived from the output terminal of the impedance converter.

5 Claims, 3 Drawing Figures

AMPLIFIER CIRCUIT

BACKGROUND OF THE INVENTION

The present invention relates to an amplifier circuit for use in various electronic apparatus.

There are many types of negative-feedback amplifier circuits. Among them, an amplifier circuit employing an operational amplifier (hereinbelow, termed "OP amplifier") can produce only one output.

Prior to the present invention, the inventors studied a first system wherein an input signal is applied to the noninverting input terminal of an OP amplifier, a first feedback resistor is connected between the output terminal and the inverting input terminal, and a second feedback resistor is connected between the inverting input terminal and ground potential, thereby to set the closed-loop voltage gain of the OP amplifier by means of the first and second feedback resistors and to derive another output signal from the node of the first and second feedback resistors through an impedance converter of high input impedance and low output impedance (for example, an emitter follower circuit). A second system was also studied wherein another output signal is derived from the noninverting input terminal through the impedance converter.

The inventors' study, however, has revealed that the other output signals derived through the impedance converters such as emitter follower circuits have large distortions in both the above systems.

SUMMARY OF THE INVENTION

It is accordingly an object of the present invention to provide an amplifier circuit which can deliver two output signals of low distortion.

In an amplifier circuit according to the fundamental feature of the present invention, the input-output path of an impedance converter is disposed within the negative feedback loop between the output terminal and inverting input terminal of an OP amplifier.

PREFERRED EMBODIMENTS OF THE INVENTION

Figure 1:
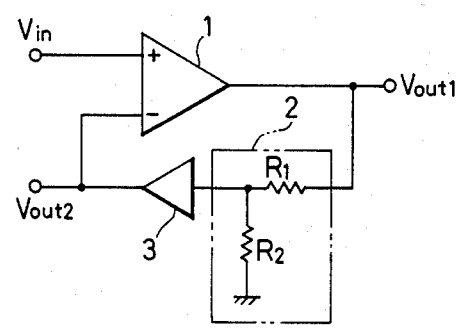
FIG. 1 is a schematic circuit diagram of an amplifier circuit according to a first embodiment of the present invention.

Now, the first embodiment of the present invention will be described with reference to FIG. 1.

The noninverting input terminal (+) of an OP amplifier 1 is supplied with an input signal $V_{in}$, and the output terminal thereof delivers a first output signal $V_{out1}$. A negative feedback circuit 2 constructed of feedback resistors $R_1$ and $R_2$ is connected to the output terminal. The input terminal of an impedance converter 3 is connected to the output terminal of the negative feedback circuit 2. The output terminal of the impedance converter 3 in the form of an emitter follower circuit provides a second output signal $V_{out2}$, which is negatively fed back to the inverting input terminal (−) of the OP amplifier 1.

In the amplifier circuit constructed as stated above, accordingly, the first output signal $V_{out1}$ is derived from the output terminal of the OP amplifier 1, and the second output signal $V_{out2}$ is derived from the output terminal of the impedance converter 3. Moreover, since the first output signal $V_{out1}$ is negatively fed back through the impedance converter 3, the distortion of the second output signal $V_{out2}$ is reduced.

Next, a second embodiment of the present invention will be described with reference to FIG. 2. In this embodiment, the OP amplifier 1 and the impedance converter 3 in the form of an emitter follower circuit are fabricated in the form of an integrated circuit (IC), and the feedback circuit 2 is externally disposed outside the IC. Such external disposition of the feedback circuit 2 is based on a reason stated below.

In case the resistors $R_1$ and $R_2$ are constructed of semiconductor diffused resistors within the IC, the depletion layer width of the PN-junction of the semiconductor diffused resistors within the IC changes due to a fluctuation in the first output signal $V_{out1}$. In consequence, the effective resistances of the resistors $R_1$ and $R_2$ are modulated, and a secondary distorted wave is generated. The feedback circuit 2 is accordingly disposed as shown in FIG. 2, being comprised of resistors $R_1$, $R_2$ and capacitor C in one example, whereby the second output signal of low distortion factor is obtained.

In the amplifier circuit constructed as stated above, when the input signal $V_{in}$ is supplied from terminal No. 1, the first output signal $V_{out1}$ is derived from terminal No. 2, and the second output signal $V_{out2}$ having a low distortion factor is derived from terminal No. 5.

Figure 2:
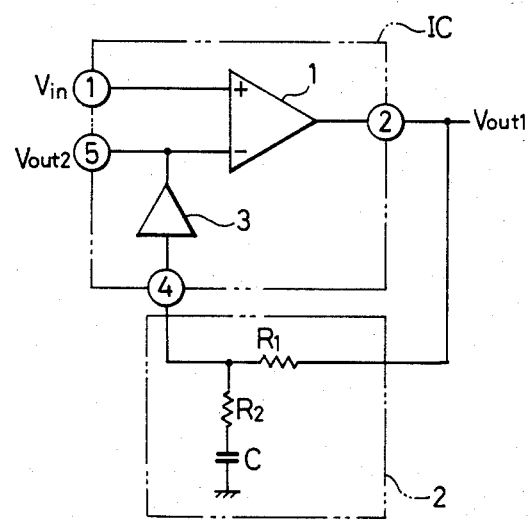
FIG. 2 is a schematic circuit diagram of an amplifier circuit according to a second embodiment of the present invention.
Figure 3:
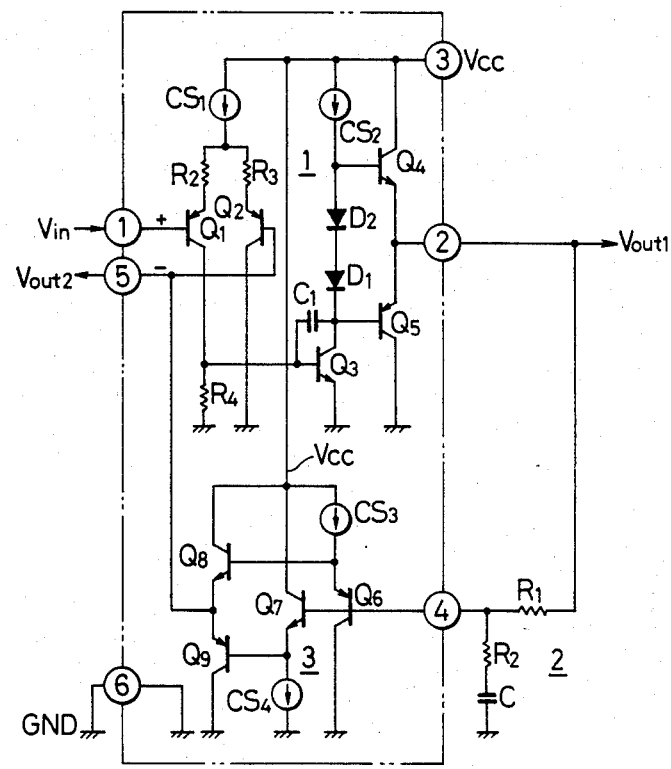
FIG. 3 is a schematic circuit diagram showing the second embodiment in detail.

FIG. 3 is a circuit diagram which illustrates in detail the second embodiment of the present invention shown in FIG. 2.

The OP amplifier 1 is constructed of a first stage differential amplifier which includes a constant current source $CS_1$, differential P-N-P transistors $Q_1$ and $Q_2$ and resistors $R_2$, $R_3$ and $R_4$; a class-A driving amplifier which includes a transistor $Q_3$, a constant current load $CS_2$, diodes $D_1$ and $D_2$ and a phase compensation capacitor $C_1$; and a push-pull output circuit which includes output transistors $Q_4$ and $Q_5$.

In particular, the impedance converter 3 is constructed of N-P-N transistors $Q_7$ and $Q_8$, P-N-P transistors $Q_6$ and $Q_9$ and constant current sources $CS_3$ and $CS_4$.

Accordingly, the temperature variations of the base-emitter voltages of the transistors $Q_6$ and $Q_8$ cancel each other, and those of the base-emitter voltages of the transistors $Q_7$ and $Q_9$ cancel each other, so that the output D.C. voltage of the impedance converter 3 can be prevented from fluctuating due to temperature changes.

Further, the positive half cycle of the output signal $V_{out2}$ is subjected to amplification by the P-N-P transistor $Q_6$ and N-P-N transistor $Q_8$ which are in the inverted Darlington connection, while the negative half cycle thereof is subjected to amplification by the N-P-N transistor $Q_7$ and P-N-P transistor $Q_9$ which are in the inverted Darlington connection. It has therefore been possible to reduce the distortion ascribable to the difference between the current gain of the N-P-N output transistor $Q_8$ and that of the P-N-P output transistor $Q_9$.

In addition, since the impedance converter 3 includes the output transistors $Q_8$ and $Q_9$ effecting the push-pull operation, the load driving ability thereof has been enhanced in case of generating the output voltage $V_{out2}$.

Moreover, since the transistors $Q_6$, $Q_8$ and $Q_7$, $Q_9$ are respectively in the inverted Darlington connections, the high input impedance characteristics of the impedance converter 3 have been further enhanced.

As set forth above, according to the amplifier circuit to which the present invention is applied, two output signals of low distortion factor can be produced with a single amplifier circuit, which is convenient for usage in audio equipment, etc. Besides, production at low cost is permitted owing to a very simple circuit arrangement.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. An amplifier circuit for producing first and second output signals of low distortion comprising an operational amplifier having a noninverting input terminal to which an input signal is to be applied, an inverting input terminal, and an output terminal from which a first output signal is derived; means for feeding back the first output signal from said output terminal of said operational amplifier to the inverting input terminal thereof, including a negative feedback circuit having its input connected to said output terminal of said operational amplifier and an impedance converter connected between the output of said negative feedback circuit and said inverting input terminal of said operational amplifier, wherein said negative feedback circuit comprises a first resistor connected between the input and output of the negative feedback circuit and a second resistor connected between the output of the negative feedback circuit and a ground potential; and means for deriving a second output signal from the output of said impedance converter.

2. An amplifier circuit as defined in claim 1, wherein said operational amplifier and said impedance converter are constructed within an integrated circuit, and said negative feedback circuit is disposed outside said integrated circuit.

3. An amplifier circuit as defined in claims 1 or 2, wherein said impedance converter comprises an emitter follower circuit.

4. An amplifier circuit as defined in claim 3, wherein said emitter follower circuit includes a pair of output transistors connected for push-pull operation.

5. An amplifier circuit as defined in claim 4, wherein said output transistors of said emitter follower circuit are respectively connected in inverted Darlington connection to first and second input transistors and respective constant current sources.

* * * * *